(12) United States Patent
Qian et al.

(10) Patent No.: US 12,335,687 B2
(45) Date of Patent: Jun. 17, 2025

(54) PIEZOELECTRIC MEMS MICROPHONE WITH CANTILEVERED SEPARATION

(71) Applicant: Skyworks Solutions, Inc., Irvine, CA (US)

(72) Inventors: You Qian, Singapore (SG); Rakesh Kumar, Singapore (SG); Guofeng Chen, Fremont, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 186 days.

(21) Appl. No.: 17/948,101

(22) Filed: Sep. 19, 2022

(65) Prior Publication Data

US 2023/0092374 A1    Mar. 23, 2023

Related U.S. Application Data

(60) Provisional application No. 63/246,202, filed on Sep. 20, 2021.

(51) Int. Cl.
*H04R 17/02* (2006.01)
*H04R 17/00* (2006.01)
(Continued)

(52) U.S. Cl.
CPC ........... *H04R 17/02* (2013.01); *H04R 17/005* (2013.01); *H04R 19/04* (2013.01); *H04R 31/00* (2013.01); *H10N 30/06* (2023.02); *H10N 30/076* (2023.02); *H10N 30/082* (2023.02); *H04R 2201/003* (2013.01)

(58) Field of Classification Search
CPC ...... H04R 17/005; H04R 17/02; H04R 19/04; H04R 31/00; H04R 2201/003; H10N 30/06; H10N 30/076; H10N 30/082; H10N 30/306
See application file for complete search history.

(56) References Cited

U.S. PATENT DOCUMENTS

| 6,657,517 | B2 | 12/2003 | Barber |
| 6,857,501 | B1 | 2/2005 | Han |

(Continued)

FOREIGN PATENT DOCUMENTS

| CN | 109495829 A | 3/2019 |
| CN | 110545514 A | 12/2019 |

(Continued)

OTHER PUBLICATIONS

Pulskamp, et al., "Mitigation of residual film stress deformation in multilayer microelectromechanical systems cantilever devices," J. Vac. Sci. Technol. B 21(6), Nov./Dec. 2003.

*Primary Examiner* — Huyen D Le
(74) *Attorney, Agent, or Firm* — Knobbe, Martens, Olson & Bear, LLP

(57) ABSTRACT

A method for making a piezoelectric microelectromechanical systems (MEMS) microphone is provided, comprising depositing a piezoelectric film layer onto a substrate; selectively etching the piezoelectric film layer to define lines; removing the substrate to define a cavity; and breaking the piezoelectric film layer along the lines, such that the microphone has at least two cantilevered beams. The piezoelectric microelectromechanical systems (MEMS) microphone is also provided.

18 Claims, 15 Drawing Sheets

(51) Int. Cl.
  *H04R 19/04*    (2006.01)
  *H04R 31/00*    (2006.01)
  *H10N 30/06*    (2023.01)
  *H10N 30/076*   (2023.01)
  *H10N 30/082*   (2023.01)

(56) References Cited

U.S. PATENT DOCUMENTS

| | | | |
|---|---|---|---|
| 8,466,606 B2 | 6/2013 | Chen | |
| 8,531,088 B2 | 9/2013 | Grosh | |
| 8,582,788 B2 | 11/2013 | Leidl et al. | |
| 9,029,963 B2 | 5/2015 | Sparks et al. | |
| 9,055,372 B2 | 6/2015 | Grosh | |
| 9,386,379 B2 | 7/2016 | Sparks | |
| 9,479,875 B2 | 10/2016 | Hall | |
| 9,516,421 B1 | 12/2016 | Loeppert | |
| 9,602,060 B2 | 3/2017 | Gorbachov et al. | |
| 9,853,201 B2 | 12/2017 | Grosh et al. | |
| 10,001,391 B1 | 6/2018 | Littrell | |
| 10,170,685 B2 | 1/2019 | Grosh et al. | |
| 10,356,531 B2 | 7/2019 | Giusti et al. | |
| 10,505,501 B2 | 12/2019 | Gorbachov et al. | |
| 10,825,982 B1 | 11/2020 | Littrell et al. | |
| 11,099,078 B1 | 8/2021 | Littrell | |
| 11,350,219 B2 | 5/2022 | Hui et al. | |
| 11,533,567 B2 | 12/2022 | Hui et al. | |
| 11,553,280 B2 | 1/2023 | Hui et al. | |
| 11,606,646 B2 | 3/2023 | Hui et al. | |
| 2006/0230835 A1 | 10/2006 | Wang | |
| 2009/0116662 A1 | 5/2009 | Wu | |
| 2009/0301196 A1 | 12/2009 | Wang et al. | |
| 2011/0124124 A1 | 5/2011 | Shih et al. | |
| 2015/0015339 A1 | 1/2015 | Gorbachov et al. | |
| 2015/0255308 A1 | 9/2015 | Lin | |
| 2015/0266717 A1 | 9/2015 | Okamoto | |
| 2016/0249122 A1 | 8/2016 | Popper et al. | |
| 2016/0258824 A1 | 9/2016 | Fuji | |
| 2017/0264253 A1 | 9/2017 | Gorbachov et al. | |
| 2017/0318385 A1 | 11/2017 | Harney et al. | |
| 2018/0077497 A1 | 3/2018 | Hatipoglu | |
| 2018/0138391 A1 | 5/2018 | Gros | |
| 2018/0186623 A1 | 7/2018 | Vossough et al. | |
| 2019/0177155 A1 | 6/2019 | Qian | |
| 2019/0289405 A1 | 9/2019 | Littrell et al. | |
| 2020/0148532 A1 | 5/2020 | Grosh et al. | |
| 2021/0021936 A1 | 1/2021 | Hui et al. | |
| 2021/0051413 A1 | 2/2021 | Hui et al. | |
| 2021/0120345 A1 | 4/2021 | Hui et al. | |
| 2021/0120346 A1 | 4/2021 | Hui et al. | |
| 2022/0166403 A1 | 5/2022 | Doll et al. | |
| 2022/0267141 A1 | 8/2022 | Chen et al. | |
| 2022/0272459 A1 | 8/2022 | Chen et al. | |
| 2022/0332568 A1 | 10/2022 | Barsukou | |
| 2022/0402751 A1 | 12/2022 | Chen et al. | |
| 2022/0408185 A1 | 12/2022 | Barsukou | |
| 2022/0408195 A1 | 12/2022 | Barsukou | |
| 2022/0408208 A1 | 12/2022 | Chen et al. | |
| 2023/0007405 A1 | 1/2023 | Qian et al. | |
| 2023/0011561 A1 | 1/2023 | Qian et al. | |
| 2023/0012046 A1 | 1/2023 | Qian et al. | |
| 2023/0039743 A1 | 2/2023 | Hui et al. | |
| 2023/0072672 A1 | 3/2023 | Chen et al. | |
| 2023/0081056 A1 | 3/2023 | Qian et al. | |
| 2023/0135200 A1 | 5/2023 | Qian et al. | |
| 2023/0136347 A1 | 5/2023 | Qian et al. | |
| 2023/0270012 A1* | 8/2023 | Littrell | H04R 17/00 310/357 |
| 2024/0140781 A1* | 5/2024 | Xia | B81B 3/0072 |

FOREIGN PATENT DOCUMENTS

| | | |
|---|---|---|
| JP | 2010-232971 A | 10/2010 |
| JP | 2018-137297 A | 8/2018 |
| KR | 10-1545271 B1 | 8/2015 |
| TW | 1727164 B | 5/2021 |
| WO | WO 2017/200219 A1 | 11/2017 |

* cited by examiner

Prior Art

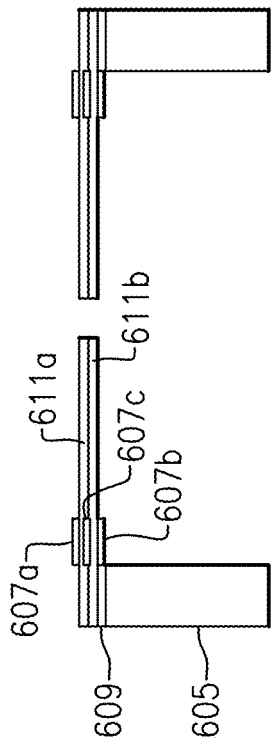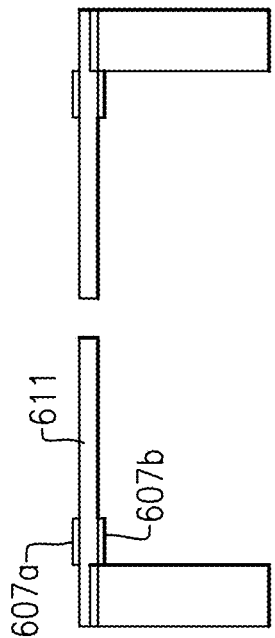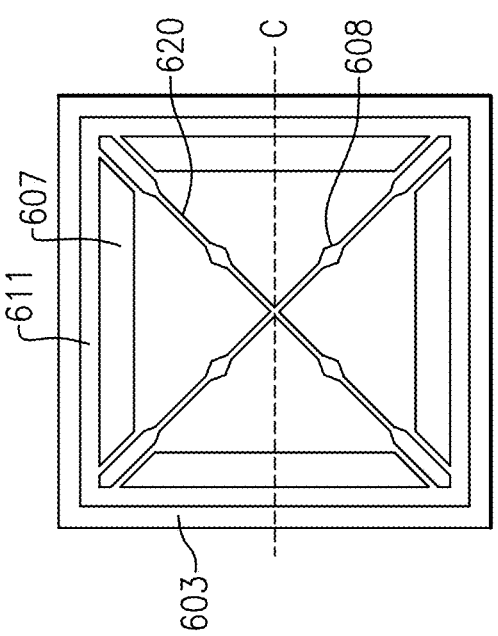
FIG.6B
FIG.6C
FIG.6A

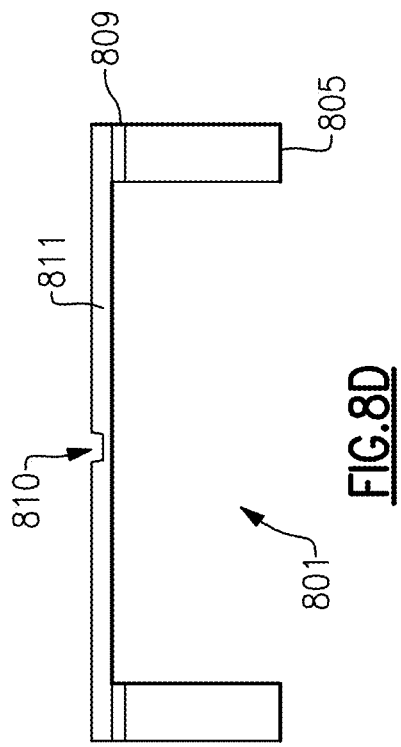
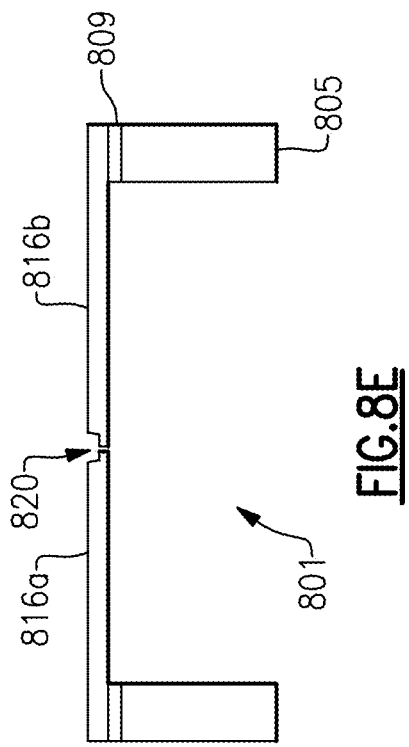
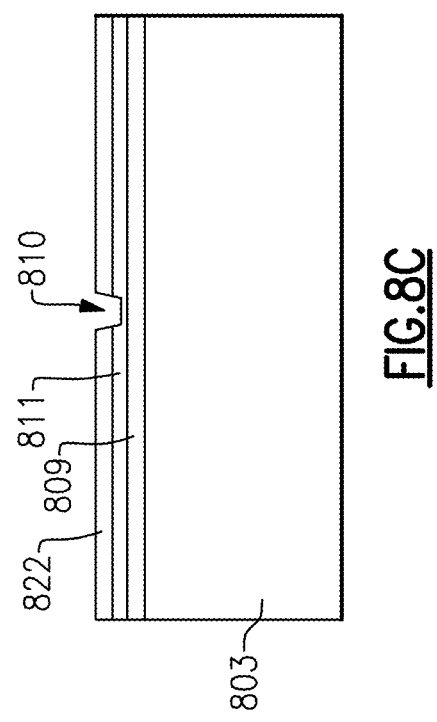

PIEZOELECTRIC MEMS MICROPHONE WITH CANTILEVERED SEPARATION

CROSS-REFERENCE TO RELATED APPLICATIONS

Any and all applications for which a domestic priority claim is identified in the Application Data Sheet of the present application are hereby incorporated by reference under 37 CFR 1.57.

BACKGROUND

Field

The present disclosure relates to a piezoelectric microelectromechanical systems (MEMS) microphone, and in particular a cantilevered piezoelectric MEMS microphone.

Description of the Related Technology

A MEMS microphone is a micro-machined electromechanical device used to convert sound pressure (e.g., voice sound) to an electrical signal (e.g., voltage). MEMS microphones are widely used in mobile devices, headsets, smart speakers and other voice-interface devices or systems. Conventional capacitive MEMS microphones suffer from high power consumption (e.g., large bias voltage) and reliability, for example when used in a harsh environment (e.g., when exposed to dust and/or water).

Piezoelectric MEMS microphones have been used to address the deficiencies of capacitive MEMS microphones. Piezoelectric MEMS microphones offer a constant listening capability while consuming almost no power (e.g., no bias voltage is needed), are robust and immune to water and dust contamination.

Piezoelectric MEMS microphones work on the principle of piezoelectric effect, so that they convert acoustic signals to electric signal when sound waves vibrate the piezoelectric sensor. The sound waves bend the piezoelectric film layers of a cantilevered beam or non-cantilevered beam, causing stress and strain, resulting in charges being generated in the piezoelectric film layers. The charges are converted to voltage as an output signal, by the placement of one or more electrodes on the piezoelectric film layers.

The sensitivity of a piezoelectric MEMS microphone depends on the acoustic resistance of the device. Some devices are therefore directed at reducing the acoustic resistance, by a variety of methods.

SUMMARY

According to one embodiment there is provided, A method for making microelectromechanical systems microphone, comprising depositing a piezoelectric film layer onto a substrate, selectively etching the piezoelectric film layer to define lines, and removing the substrate to define a cavity, breaking the piezoelectric film layer along the lines, such that the microphone has at least two cantilevered beams.

In one example the selectively etching comprises etching the entire thickness at selected positions of the piezoelectric film layer to form perforations along the lines. Optionally the perforations have sharp edges.

In one example selectively etching comprises etching less than the entire thickness of the piezoelectric film layer to form partial etches along the line.

In one example selectively etching comprises both etching the entire thickness at selected positions of the piezoelectric film layer to form perforations and etching the piezoelectric film layer less than the entire thickness to form partial etches between the perforations along the line.

In one example breaking the piezoelectric film layer comprises applying thermal cycling.

In one example breaking the piezoelectric film layer comprises applying mechanical shock.

In one example breaking the piezoelectric film layer comprises applying air pressure.

In one example breaking the piezoelectric film layer comprises breaking by intrinsic stress.

In one example the breaking forms a gap and the method further comprises using wet etching to widen the gap after breaking.

In one example the breaking forms a gap and wherein the depositing of the piezoelectric layer provides intrinsic stress to the layer such that the gap formed by breaking is widened due to the intrinsic stress.

In one example the method further comprises depositing electrodes. Optionally the electrodes are deposited adjacent the anchor region.

In one example method further comprises depositing a photoresist layer. Optionally the method further comprises removing a section of the photoresist layer.

In one example the removing of a section of the photoresist layer uses light.

In one example the removing of a section of the photoresist layer using light, and a chemical etch.

In one example the piezoelectric film layer is deposited by sputtering.

In one example the method further comprises oxidizing the substrate to form an insulating layer located between the substrate and piezoelectric film layer.

According to another embodiment there is provided, a piezoelectric microelectromechanical systems microphone, comprising a substrate including walls defining a cavity and at least two of the walls defining a respective anchor region, a piezoelectric film layer defining at least two beams each respective beam supported by the substrate at each anchor region such that the piezoelectric film layer is cantilevered, the beams being separated by selectively etching the piezoelectric film layer to define lines and breaking along the lines, and an electrode disposed over the piezoelectric film layer.

In one example the microphone comprises three electrodes.

In one example the piezoelectric film layer is around 0.4 micrometers to 2 micrometers thick.

In one example the piezoelectric film layer has a width and/or length of around 0.1 millimeters to 1 millimeter.

According to another embodiment there is provided, a wireless mobile device comprising:

one or more antennas, a front end system that communicates with the one or more antennas, and one or more piezoelectric microelectromechanical systems microphones, each microphone including: a substrate including walls defining a cavity and at least two of the walls defining a respective anchor region, a piezoelectric film layer defining at least two beams each respective beam supported by the substrate at each anchor region such that the piezoelectric film layer is cantilevered, the beams being separated by selectively etching the piezoelectric film layer to define lines and breaking along the lines, and an electrode disposed over the piezoelectric film layer.

Still other aspects, embodiments, and advantages of these exemplary aspects and embodiments are discussed in detail below. Embodiments disclosed herein may be combined with other embodiments in any manner consistent with at least one of the principles disclosed herein, and references to "an embodiment," "some embodiments," "an alternate embodiment," "various embodiments," "one embodiment" or the like are not necessarily mutually exclusive and are intended to indicate that a particular feature, structure, or characteristic described may be included in at least one embodiment. The appearances of such terms herein are not necessarily all referring to the same embodiment.

BRIEF DESCRIPTION OF THE DRAWINGS

Various aspects of at least one embodiment are discussed below with reference to the accompanying figures, which are not intended to be drawn to scale. The figures are included to provide illustration and a further understanding of the various aspects and embodiments, and are incorporated in and constitute a part of this specification, but are not intended as a definition of the limits of the invention. In the figures, each identical or nearly identical component that is illustrated in various figures is represented by a like numeral. For purposes of clarity, not every component may be labeled in every figure. In the figures:

FIG. 6A is a plan view of an electrode arrangement according to aspects of the present invention;

FIG. 6B is a cross sectional view of an electrode arrangement according to aspects of the present invention;

FIG. 6C is a cross sectional view of an electrode arrangement according to aspects of the present invention;

FIG. 8A-8E show the method steps of making a microphone in accordance with the present invention;

DETAILED DESCRIPTION

Aspects and embodiments described herein are directed to a method for making a MEMS microphone for reducing the gap between cantilevers, such that the acoustic resistance is decreased and the sensitivity increased. The method results in a cantilever with a higher tolerance to bending and mismatch of the cantilevers, which may arise due to intrinsic stress from manufacturing.

It is to be appreciated that embodiments of the methods and apparatuses discussed herein are not limited in application to the details of construction and the arrangement of components set forth in the following description or illustrated in the accompanying drawings. The methods and apparatuses are capable of implementation in other embodiments and of being practiced or of being carried out in various ways. Examples of specific implementations are provided herein for illustrative purposes only and are not intended to be limiting. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms.

Figure 1A:
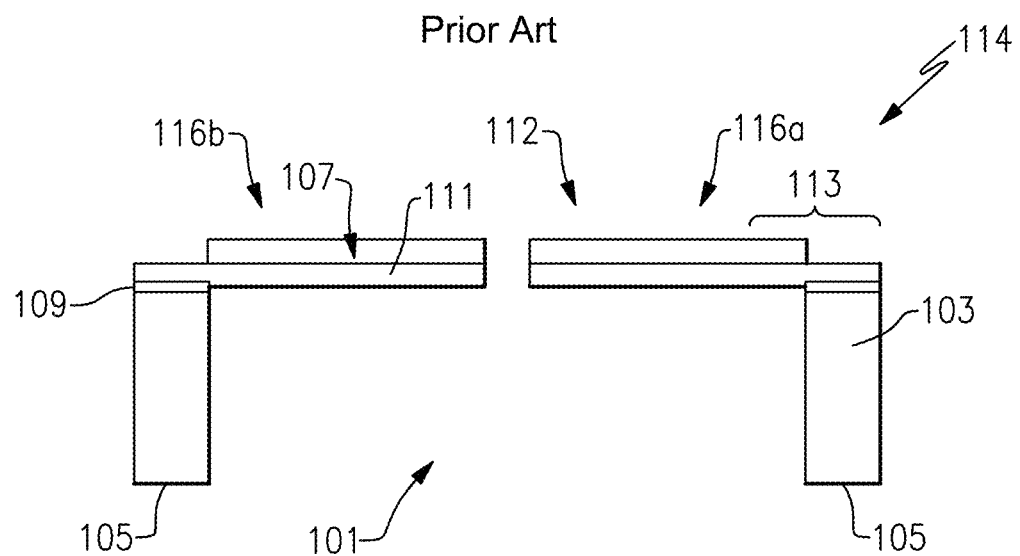
FIG. 1A is a cross-sectional view of a microphone according to known arrangements.

FIG. 1A shows a cross sectional view of a known implementation of a piezoelectric microelectromechanical systems (MEMS) microphone 100 (hereinafter the "microphone"). The microphone 100 is a piezoelectric MEMS cantilever microphone. The microphone 100 comprises a substrate 103. The substrate 103 is optionally made of silicon. The substrate 103 has two side walls 105, arranged such that they extend perpendicular to the length of the one or more cantilevered beams 116. The cantilevered beams 116a and 116b are composed of one or more piezoelectric film layers 111. Two further end walls (not shown) complete the cavity on opposite sides, such that they meet the side walls at right angles, and a further structure, described in relation to FIG. 7, may be on the underside of the cavity. At least one of the side walls 105 defines an anchor region 113. The anchor region is the area where the piezoelectric film layer 111 is coupled to and supported by one of the side walls. The microphone 100 optionally comprises an insulation layer 109 disposed on a surface of the substrate 103. The insulation layer is optionally silicon dioxide. The piezoelectric film layer 111 is supported by the substrate 103 at the anchor region 113, such that the piezoelectric film layer 111 is cantilevered and extends between a fixed end 114 and a free end 112. The microphone comprises at least one electrode 107 located on the piezoelectric film layer 111. The electrode 107 may be located adjacent the anchor region 113, and may cover the entire cantilevered beam 116a and 116b. However in some embodiments, the electrode may not cover the entire cantilevered beam, such that an area of the piezoelectric film layer away from the anchor region may be exposed underneath the electrode 107. In other embodiments, the electrode may be located on the underside of the piezoelectric film layer 111. It will be appreciated that FIG. 1A is a cross sectional view, such that there may be two additional cantilevered beams, one extending over the cavity from a first end wall and the other extending over the cavity from a second end wall. In the arrangement comprising four cantilevered beams, the beams are triangular in shape, as shown in plan view, FIG. 1B.

Figure 1B:
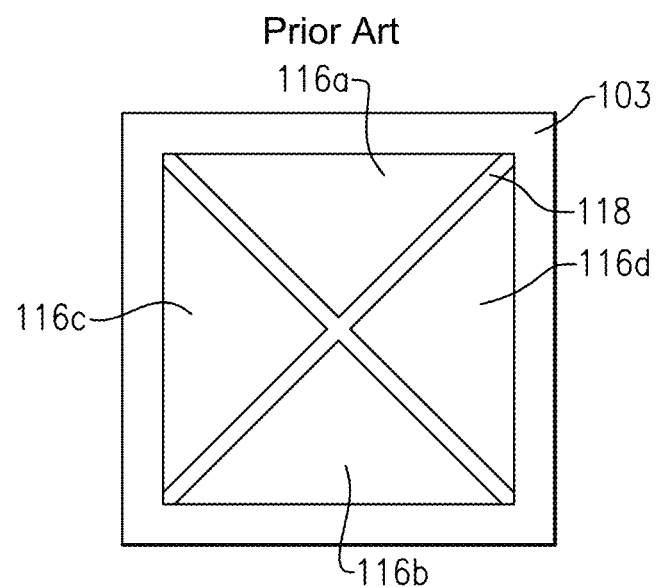
FIG. 1B is a plan view of a microphone according to known arrangements.
Figure 1C:
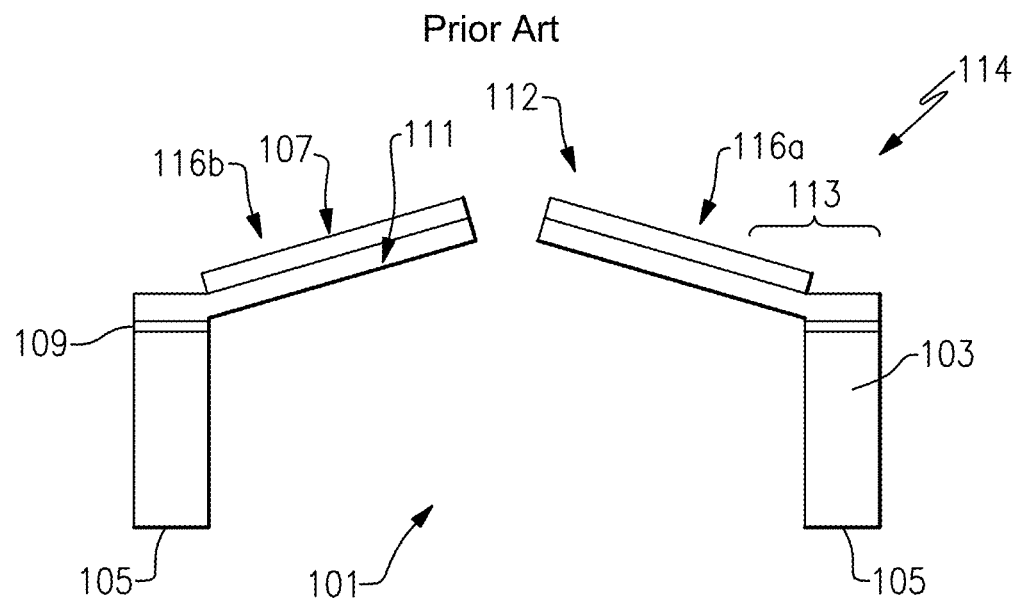
FIG. 1C is a cross-sectional view of a microphone with bending cantilevers according to known arrangements.
Figure 1D:
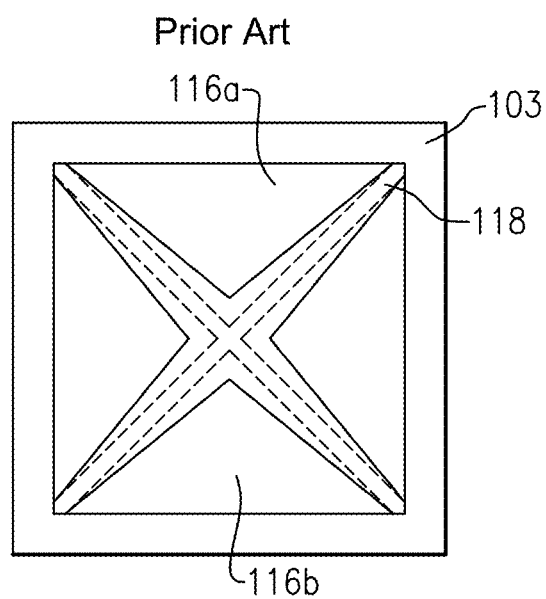
FIG. 1D is a plan view of a microphone with bending cantilevers according to known arrangements.

FIGS. 1C and 1D illustrate an arrangement resulting from a high stress gradient in the material, in which the cantilevered beam bends upwards or downwards, i.e. into or out of the cavity. FIG. 1C shows the cross sectional view of the cantilevered beam bending upwards, and FIG. 1D illustrates the consequential change in size of the gap between the cantilevered beam and into the cavity, by showing a plan view. The dashed line illustrates the outline of the gap 118 illustrated in the arrangement of FIG. 1B, showing the increase in gap size. The bending of the cantilevered beam upwards arises due to the manufacturing of piezoelectric film layers which is commonly via physical vapor deposition. The manufacturing process introduces a high stress gradient in the material so that the resultant piezoelectric film layer, which forms the cantilevered beam, may not be completely flat. The cantilevered beam may be created using a stress compensation technique, where the cantilevered beam comprises two piezoelectric film layers with different average stress such that their combination results in a cantilevered beam with less bending. The gap results in a decrease in sensitivity and a decrease in acoustic resistance due to an increase in air flow. Furthermore, the beams may bend to different amplitudes due to intrinsic stress, creating a mismatch between the amplitude of bend of the beams. It will be appreciated that a mismatch of bend amplitude increases the gap between the beams to a greater extent than if all of the beams were bent to a larger but same amplitude. Therefore, we have appreciated that starting with a smaller gap between the cantilevers will result in a higher tolerance of the cantilever mismatch and bending. Techniques to achieve this are discussed herein, such as in relation to FIGS. 2-10.

Figure 2A:
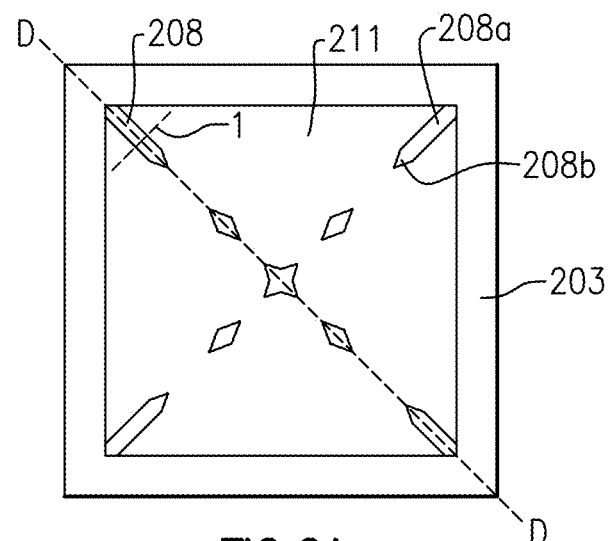
FIG. 2A is a plan view of a microphone comprising perforations according to aspects of the present invention.

FIG. 2A-2D show a plan view of a first step of a method for forming a MEMS microphone according to an embodiment of the present invention prior to breaking the piezoelectric film layer to form cantilevers. A piezoelectric film layer 211 is deposited onto a substrate 203, wherein the piezoelectric film layer may be composed of Scandium Aluminum Nitride or Aluminum Nitride, or any other suitable piezoelectric material. The layer 211 is preferably formed by a sputtering method, to form a polycrystalline structure, due to its low cost and deposition rate. However, it will be appreciated that other methods may be used, such as molecular beam epitaxy. Multiple layers of piezoelectric material may be deposited at separate times, such that the piezoelectric film layer may be composed of two, or three, or any number of layers. The one or more piezoelectric film layers may be a total thickness of 0.4 micrometers to 2 micrometers. Preferably the one or more piezoelectric film layers have a total thickness of between 0.4 and 1 micrometers. The one or more piezoelectric film layers may be any shape or size. Preferably the one or more piezoelectric film layers have a width and a length of 0.1 millimeters to 1 millimeter, such that the device has a square cross section, as illustrated in the FIGS. 2A-6A. The substrate 203 is preferably silicon, but it will be appreciated that it can be any suitable material. For example, in some embodiments in which there is an oxide layer located on the silicon, the substrate as described herein may refer to the silicon with a layer of silicon dioxide. Where other materials are used instead of silicon, the material and its oxide may form the substrate. In the first step of the forming of the microphone of the present embodiment, as shown in FIG. 2A, although not able to be seen, the substrate 203 is solid underneath the piezoelectric film layer 211, such that in this step, the piezoelectric film layer 211 overlays the substrate along its whole area. Although shown as a square shape, it will be appreciated that the piezoelectric film layer, and the substrate, may be any shape. For example the piezoelectric film layer and the substrate may be any quadrilateral shape, or may any other suitable shape. The one or more piezoelectric film layers are deposited as a whole layer, with no gaps. In the step shown in FIG. 2A the one or more piezoelectric film layers 211 are etched through the thickness of the layer 211 in the sections as along label 1, to create a perforation 208. As described herein "perforation" refers to a section of removed material, such that the entire thickness of the material is removed, therefore exposing a substrate, or layer of material underneath. The removal of material, to form the perforations, may be achieved by etching, mechanical means, or any suitable method to remove a material. In embodiments in which the material is removed by etching, any suitable etchant may be used to etch the piezoelectric film layer. For example, for a piezoelectric film layer composed of AlN, Cl2 may be used in a reactive ion etch. Perforations may be referred to as holes, gaps, apertures, etches, or slits. As described herein, the perforations form a line in the material, such as line D shown in FIG. 2A. The material may be selectively etched, i.e. etched at selected positions, to form a line of perforations. The perforations may be spaced any distance apart, such that the between the perforations, i.e. along the line, is weakened.

Figure 2B:
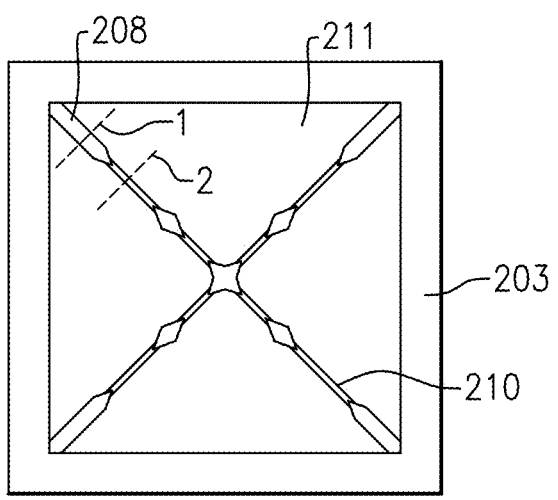
FIG. 2B is a plan view of a microphone comprising perforations and partial etches according to aspects of the present invention.
Figure 2C:
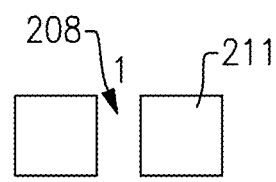
FIG. 2C is a cross sectional view of a perforation according to aspects of the present invention.

This is shown in FIG. 2C which shows a cross sectional view of the etched gap 208 in the piezoelectric film layer 211. The perforation 208 may be from 0.2 micrometers to 1 micrometer in width and/or in length. In this embodiment the etched perforations are located at the corners of the piezoelectric film layer, the center of the piezoelectric film layer, and between the corner and center etches, such that they create a line, shown in FIG. 2A as line D, and separate the piezoelectric film layer into multiple triangular arrangements. However, it will be appreciated that the perforations may be located in different locations, to create sections in different shapes. It will be appreciated that there may be more or fewer perforations, as described in other embodiments described herein. As illustrated these perforations are etched in a shape whose width changes such that there is a pointed end 208b and a wider center section 208a, for example a diamond or a rectangle with a pointed end 208b as shown in the plan view. As seen the perforations are formed such that the pointed ends, and thus the perforations, are oriented along the line D. It will be appreciated that the perforation may be any shape, preferably the shape has a sharp, or pointed end. The sharp or pointed end increases the stress in the region of the pointed end thereby increasing stress between two points and thereby the stress is increased along the lines between the perforations. The selective etching of the material, i.e. the piezoelectric film layer, may also include etching to a limited depth, such that the etch does not extend completely through the thickness of the piezoelectric film layer. This is shown in FIG. 2B. In other words, the piezoelectric film layer is etched less than its entire thickness. This may be referred to as partial etching, to form a partial etch. It will be appreciated that the depth of the partial etch is such that the material has been weakened sufficiently to break, but the etch has not extended through the entire depth of the material. The partial etch 210 is an etch from the side of the piezoelectric film layer opposite to the cavity where the etch does not extend the entire way through the thickness of the piezoelectric film layer, such as shown in the cross sectional view along line 2, shown in FIG. 2D. The piezoelectric film layer may be partially etched, such that the partial etches 210 may extend between the perforations 208 along the line formed by the perforations, line D as shown in FIG. 2A. In this embodiment, the piezoelectric film layer is separated into four triangular regions by the perforations 208 and partial etches 210, as shown in FIG. 2B. Any suitable etchant may be used to etch the piezoelectric film layer. For example, for a piezoelectric film layer composed of AlN, C12 may be used in a reactive ion etch. It will be noted that in some embodiments, only perforations 208 may be made, such that there are no partial etches 210, i.e. as shown in the FIG. 2A, in which the additional step shown in FIG. 2B is not performed. In an embodiment in which there are only perforations and no partial etches, the pointed ends may provide sufficient weakening of the material along the line D between perforations, that the material may be broken along the line. It may be required that there are more perforations along the line in an embodiment in which there are no partial etches, than in an embodiment in which there are also partial etches, such that the material is further weakened to aid the breaking.

Figure 2D:
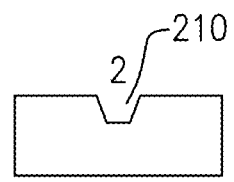
FIG. 2D is a plan view of a partial etch according to aspects of the present invention.
Figure 3A:
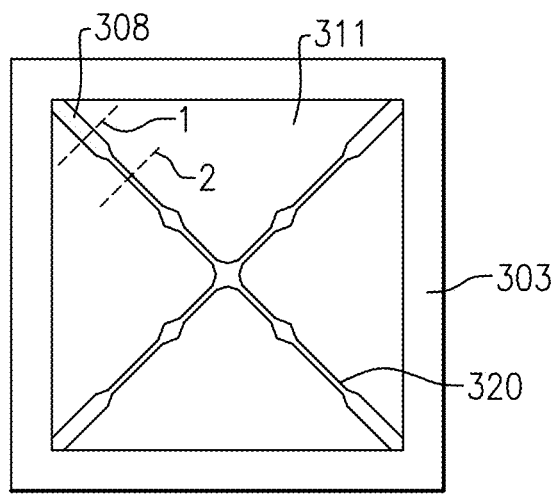
FIG. 3A is a plan view of a microphone comprising perforations and gaps according to aspects of the present invention.
Figures 3B, 3C:
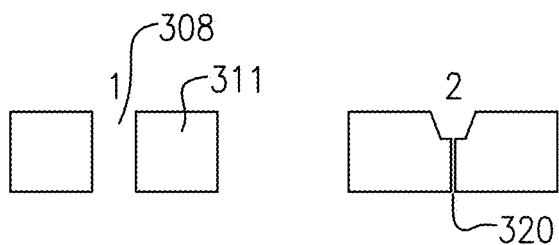
FIG. 3B is a cross sectional view of a perforation according to aspects of the present invention.
FIG. 3C is a plan view of a gap according to aspects of the present invention.

FIGS. 3A-3C show a plan view of the second step of the method of FIGS. 2A-2D of forming a MEMS microphone according to the embodiment of the present invention, wherein the piezoelectric film layer is shown after the breaking to form cantilevers. In this embodiment, the method described in relation to FIG. 3A is carried out following the method as described in relation to FIG. 2B. Although not shown in this figure, before the second step of forming the MEMS microphone of the embodiment can be carried out, the substrate underneath the section of the piezoelectric film layer which will form the cantilevered beams must be removed. Without the removal of this substrate, the piezoelectric material will not be able to break, as will be described herein. The process of removing the substrate is described later in this application. As described in FIGS. 2A-2C, there are perforations 308 which extend through the entire depth of the piezoelectric film layer 311. These perforations 308 are shown in FIG. 3A, and the cross sectional view of the piezoelectric film layer shown in FIG. 3B. The partial etches, as described in relation to FIGS. 2B and 2D, are broken through in this second step, such that the four triangular sections, in this embodiment, are separated by a gap 320, and are no longer joined together. FIG. 3C shows a cross sectional view, taken along line 2, of the break through the piezoelectric film layer. It will be understood, that here the breaking means that there is no material removed, unlike etching, and instead the piezoelectric film layer is broken or split for the remaining depth which the piezoelectric material was not fully etched beyond. The gap formed in the piezoelectric film layer due to breaking will be substantially zero nanometers as no material has been removed. In some embodiments, after the breaking of the partial etch 310, an additional wet etch may be carried out to widen the gap 320 formed by breaking by around 1-2 nanometers. The etchant used may be a very diluted solution, such that the amount of piezoelectric material removed from between the cantilevers is very small. The widening of the gap by the additional 1-2 nanometers may be preferable so that the cantilevers do not contact each other when they bend in response to acoustic signals, which would occur if the gap 320 created from breaking is too small. In other embodiments, there may be sufficient intrinsic stress in the piezoelectric film layers, that when the cantilevers are separated by breaking, the cantilevers may shrink and therefore increase the width of the gap 320. This may increase the gap by around 1-2 nanometers. The partial etch of the first step is carried out as it weakens the material, and due to a polycrystalline material being composed of many small crystals and thus many grain boundaries, it will break along the weakened line when the material is under stress. The weakened line and pointed end of the perforations improve the accuracy of the break. The piezoelectric film layer may be exposed to stress in any suitable way. In some embodiments there may be sufficient intrinsic stress within the material due to manufacturing that after the removal of the substrate, the piezoelectric film layer breaks along the lines of partially etched material. In some embodiments this stress may be due to high temperatures in the photoresist process, and/or due to the high temperatures for etching the photoresist layer and/or for etching the piezoelectric film layer. These high temperatures may create stress in the one or more piezoelectric film layers which is sufficient to break the piezoelectric film layers. The stress may be controlled, such that for the chosen dimension it may be possible to break the piezoelectric film layers. In some embodiments the intrinsic stress is not sufficient to break the piezoelectric film layers once the substrate underneath has been removed, the process of which is described herein. In these embodiments thermal cycling may be used to create sufficient stress due to high temperatures, which then breaks the piezoelectric film layers along the partial etch. The thermal cycling may comprise putting the device in an oven to heat it to a high temperature. In other embodiments, a mechanical shock, or an acoustic shock, or a pressure shock, or any other suitable method may be used to break the piezoelectric film layer along the partially etched material.

Figure 4A:
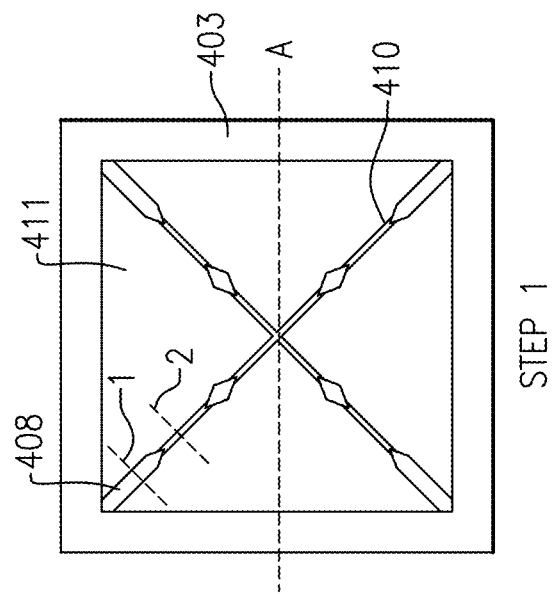
FIG. 4A is a plan view of a microphone according to aspects of the present invention.
Figure 4A:
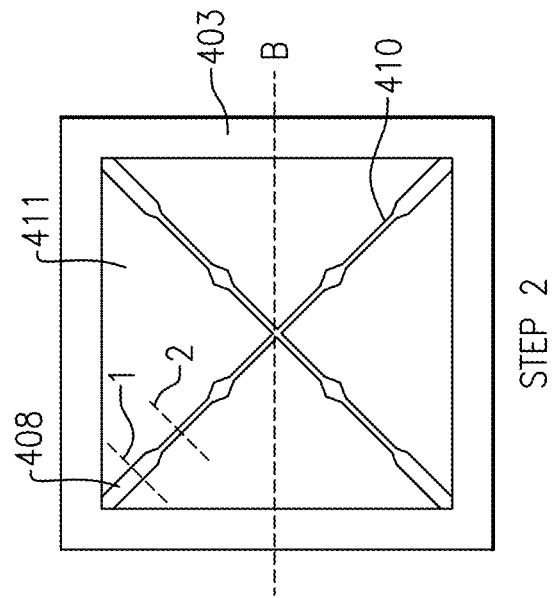

FIG. 4A shows a plan view of an alternative method of forming a piezoelectric microphone according to an embodiment of the present invention. It will be appreciated that the features and their dimensions may be the same as described in relation to FIGS. 2A-2D and 3A-3C. This embodiment is identical to the embodiment of FIGS. 2A 2D and 3A-C, except that the center of the piezoelectric material comprises a partial etch rather than a perforation formed in the first step of the method, which is broken in step 2, to separate the cantilevers. A perforation is not required in the center of the piezoelectric film layer, as the stress arising from the perforations along the line away from the center may be sufficient to break a partial etch in the center of the piezoelectric film layer. This would result in the minimum gap between the free ends of the cantilevered beams, which may be preferable in some embodiments.

Figure 4B:
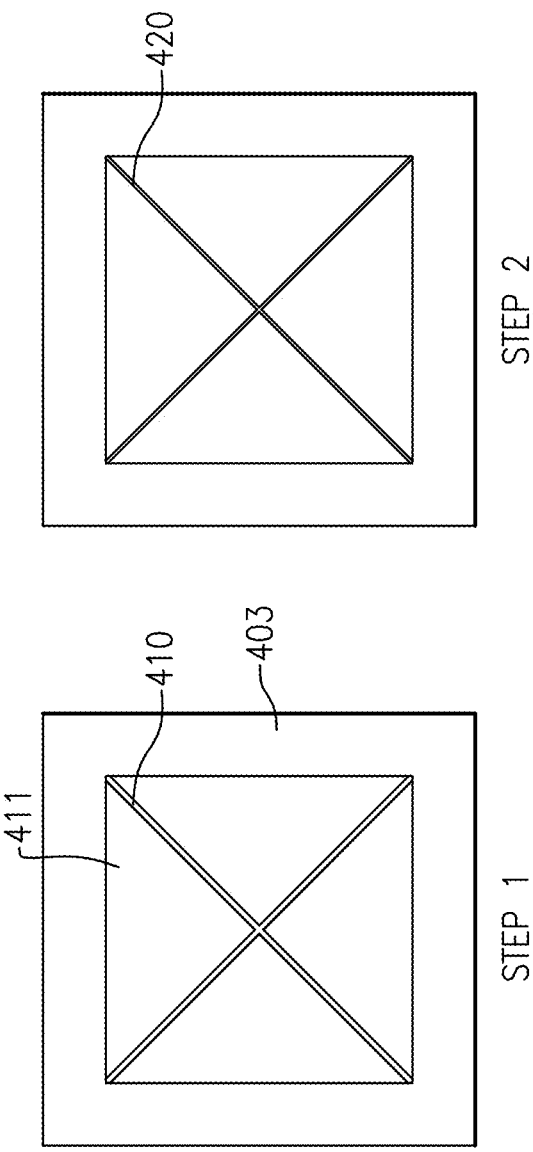
FIG. 4B is a plan view of a microphone according to aspects of the present invention.

FIG. 4B shows a plan view of an alternative method, without perforations, of forming a piezoelectric microphone according to an embodiment of the present invention. It will be appreciated that the features and their dimensions may be the same as described in relation to FIGS. 2A-2D and 3A-3C. In this embodiment the piezoelectric film layer is separated into sections by lines of partial etches 410 such that the etches do not extend the entire thickness of the piezoelectric material, as described in relation to FIGS. 2B and 2D. In this embodiment, as shown, the piezoelectric film layer 411 is separated into four triangular sections by partial etches 410, shown in step 1. The partial etches 410 are subsequently broken to form gaps, and separate the sections.

However it will be appreciated that there may be any number of sections, where each section may be any shape suitable for a cantilevered microphone. As described in relation to FIGS. 2A-2D and 3A-3B, the substrate 403 is removed from the underside of the piezoelectric layer, such that the cantilever is supported by the substrate walls, at the anchor region, and is free to move where not supported by the anchor region. When the substrate has been removed, in some embodiments there may be sufficient intrinsic stress to break the partial etch 410, such that the piezoelectric film layer is separated into sections, with a gap 420 in-between, as described in the embodiment of FIGS. 2A and 3A. In other embodiments a mechanic shock, or an acoustic shock, or a pressure shock may be used to break the partial etch.

The perforations 408, and the partial etches may be any shape or size, and may be positioned in a line of any direction and length, such that the piezoelectric film layer may be broken into separate portions which each form a cantilever.

In some embodiments, after the breaking of the partial etch 410, an additional wet etch may be carried out to widen the gap 420 formed by breaking by around 1-2 nanometers. The etchant used may be a very diluted solution, such that the amount of piezoelectric material removed from between the cantilevers is very small. The widening of the gap by the additional 1-2 nanometers may be preferable so that the cantilevers do not contact each other when they bend in response to acoustic signals, which would occur if the gap 420 created from breaking is too small. In other embodiments, there may be sufficient intrinsic stress in the piezoelectric film layers, that when the cantilevers are separated by breaking, the cantilevers may shrink and therefore increase the width of the gap 420. This may increase the gap by around 1-2 nanometers.

Figure 5A:
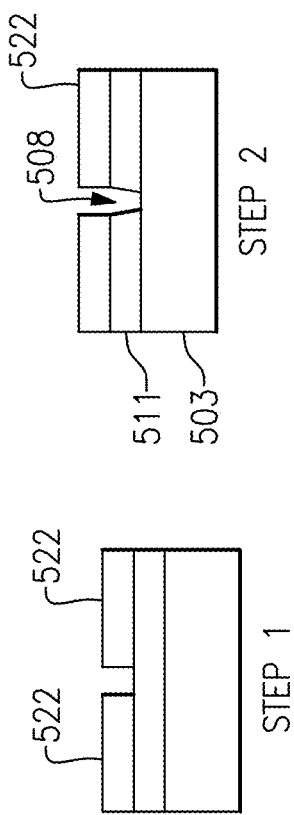
FIG. 5A is a cross sectional view of two steps of forming a perforation according to aspects of the present invention.
Figure 5B:
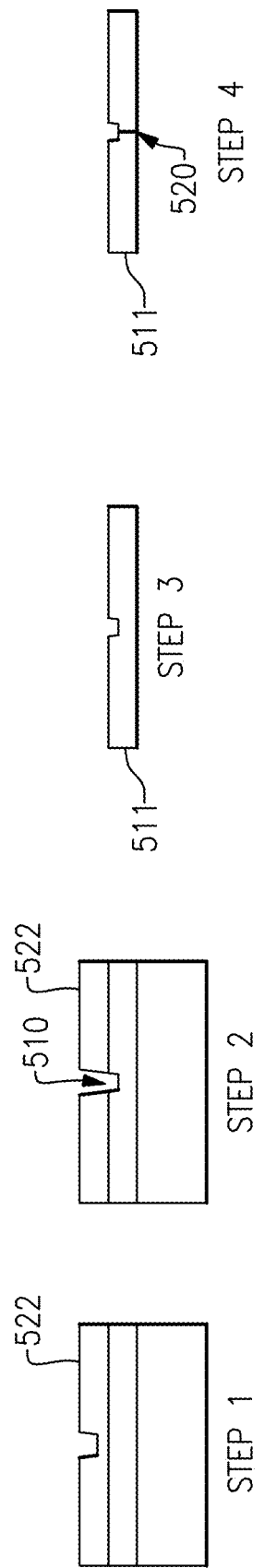
FIG. 5B is a cross sectional view of two steps of forming a gap according to aspects of the present invention.

FIGS. 5A-5F illustrate a cross sectional view of the depositing and etching process, for the embodiments described herein, such as the embodiments of FIGS. 2A-2D and 3A-3C. FIG. 5A shows step 1 and step 2 illustrating the making of the perforations 508, as shown along the line labelled 1 in FIG. 2A. FIG. 5B illustrates in steps 1 and 2, the making of the partial etches, as shown along the line labelled 2 in FIG. 2B and FIG. 4A. Steps 3 and 4 of FIG. 5B illustrate the breaking of the partial etches, as shown in FIGS. 3A and 4B.

As illustrated in FIGS. 5A-5B the piezoelectric film layer 511 is overlaid with a photoresist layer 522, and is deposited onto of a substrate 503, as described herein. The photoresist layer may be a polymer. The piezoelectric layer may be Aluminum nitride (AlN) or Scandium doped Aluminum nitride (ScAlN). The substrate may be silicon. Although not shown here, there may be an insulating layer between the piezoelectric layer 511 and the substrate 503. Preferably the insulating layer is silicon dioxide. FIGS. 5A and 5B show the first step of etching both the perforation 508 and the partial etch 510 respectively. In the first step the photoresist layer is removed for the perforation and the partial etch at the same time. In this step, the photoresist layer is removed by exposure to light. The critical dimension is defined as the smallest feature which can be etched, such that a dimension smaller than critical dimension results in a narrower, and less deep etch. The dimension of the exposure for the partial etch is smaller than critical dimension, such that the photoresist layer in the section to be partially etched is exposed to less light, and therefore less depth of the photoresist is removed, as shown in FIG. 5B step 1. Due to sub-critical dimension feature, it will be seen that the width of the indent in the photoresist layer is smaller in the partial etch. The depth control of the removal of part of the photoresist layer is not very accurate, as photoresist or etching processes may not be uniform. Instead there may be sections of the material which etch at different rates, however when a full etch is carried out, the different sections of the material finish etching at different times, but the depth will be the same as there may be a different material underneath the material at which the etch will stop. However, in partial etching, the etch may only be time controlled, and therefore different sections may have a different depth of etch. However, this does not negatively affect the invention described herein in which the partial etch is to weaken the material before breaking.

The second step of forming the perforation 508 and the partial etch 510 is shown in FIGS. 5A and 5B respectively. Both the etching to form perforations and partial etches are carried out at the same time, using a reactive ion etch. The etching of the perforations and partial etches are done using the same amount of etchant. As described above, the perforations are sections which are etched through the whole thickness of the material. Therefore, the exact amount of etchant required to create a perforation is used for the forming of both the perforations and the partial etches. However, as shown in FIG. 5B in steps 1 and 2, before the piezoelectric film layer is able to be etched to form the partial etch, the remaining photoresist layer still needs to be removed. Therefore, the etchant is required to dissolve this before the piezoelectric film layer can be etched. In this way, by the time the perforation has been formed in step 2 of FIG. 5A, the piezoelectric film layer of FIG. 5B has not been fully etched. Thus resulting in a partial etch 510.

As illustrated in FIG. 5B steps 3 and 4, the substrate is removed from underneath the piezoelectric film layer. The photoresist layer may be removed, leaving the piezoelectric film layer 511. FIG. 5B step 4 shows the breaking of the partial etch 510, such that there is a gap 520 extending through the entire depth of the piezoelectric film layer, separating the piezoelectric film layer into sections, as described elsewhere. In some embodiments, after the breaking of the partial etch 510, an additional wet etch may be carried out to widen the gap 520 formed by breaking by around 1-2 nanometers. The etchant used may be a very diluted solution, such that the amount of piezoelectric material removed from between the cantilevers is very small. The widening of the gap by the additional 1-2 nanometers may be preferable so that the cantilevers do not contact each other when they bend in response to acoustic signals, which would occur if the gap 520 created from breaking is too small. In other embodiments, there may be sufficient intrinsic stress in the piezoelectric film layers, that when the cantilevers are separated by breaking, the cantilevers may shrink and therefore increase the width of the gap 520. This may increase the gap by around 1-2 nanometers.

It will be noted that the photoresist etch of the perforation 508, shown in FIG. 5A, may be a perfect etch, such that the walls of the etched substrate are vertical in the cross sectional view. This arises from the perfect removal of the photoresist layer in which the perfect condition is used to remove the layer. It will be appreciated that the use of an insufficient amount of energy, or out of focus, will result in slanted walls in the cross sectional view, as shown in FIG. 5B. Here, the critical dimension is smaller so that less depth of the photoresist layer is removed.

The etch of the piezoelectric film layer, as shown in step of FIGS. 5A and 5B, may create slanted walls in the cross sectional view. The walls may be slanted around 30 degrees from the horizontal. It will therefore be appreciated that for greater depths of etching required, the critical dimension will have to be larger, such that the walls do not diverge before the material is etched to the required depth.

FIG. 6A shows a plan view of an electrode arrangement according to some embodiments. As illustrated, the electrode may be located at the anchor region of the cantilever. The electrode may be the same shape and size as the anchor region of the cantilever, such that the piezoelectric material is exposed at the tip of the cantilever. In some embodiments, such as in an embodiment with a triangular cantilever, the electrode may be a truncated triangle. The electrodes may be adjacent the anchor region as the anchor region experiences less bending, and thus the gap etched may be larger without adversely affecting the acoustic resistance of the device. Whereas towards the center of the piezoelectric film layer, i.e. towards the free end of the cantilever, it is more important for the gap between the cantilevers to be smaller, to minimize bending and thus improve the acoustic resistance. Therefore it would not be convenient for an electrode to be placed away from the anchor region.

It will be appreciated that the electrode is not located along the lines at which the piezoelectric film layer is to be separated, as the electrode is metallic, and thus would not provide a break as accurate as the piezoelectric film layer(s). Furthermore, etching the electrode would expose the metal to the outside environment, which is not preferable. Therefore, the electrode is not shown in the figures of 2-5, at which the etches and breaks are shown. The etches and breaks are therefore carried out just through the piezoelectric film layers, even when electrodes are located in between layers.

It will be noted that the figures are for illustrative purposes only, and are not to scale. These arrangements are not limiting, and additional piezoelectric layers and/or additional electrodes may be present in other embodiments, and the arrangement would be varied accordingly, to achieve the same result as described here. It will be noted that although the electrodes are illustrated as being the same shape as the piezoelectric material, such that the electrode covers, or is covered by, the piezoelectric layer, the electrodes may be of a different shape to the piezoelectric layer(s). For example, the one or more electrodes may be located at the free end of the adjacent piezoelectric layer, and/or the one or more electrodes may be located at the center of the adjacent piezoelectric layer, and/or the one or more electrodes may be located that the fixed end of the adjacent piezoelectric layer. These shapes and placements have the result that the electrodes may have a smaller area, and therefore the capacitance may be reduced. Therefore, the one or more electrodes may only be located adjacent the anchor region, where the stress and strain is highest. It will be noted that the one or more electrodes may be any size, such that their size may be chosen to achieve a desired result. It will noted that any suitable conductive material can be used for the one or more electrodes, for example molybdenum or titanium.

In some embodiments the microphone may comprise two electrodes, such that there is a bottom electrode, and a top electrode, as shown in the cross sectional view in FIG. 6B, taken along line C of FIG. 6A. In some embodiments the microphone may comprise two piezoelectric film layers, and three electrodes, such that there is a top 607*a*, bottom 607*b*, and middle 607*c* electrode, with piezoelectric film layers disposed in between, as shown in the cross sectional view in FIG. 6C, taken along line C. In some embodiments the microphone may comprise an insulating layer 609 located between substrate walls 605 and the piezoelectric film layer 611. Alternatively, in the case in which there are multiple piezoelectric film layers, the insulating layer 609 is located between the piezoelectric film layer 611*b* on the cavity side. The insulating layer may be silicon dioxide.

Figure 7A:
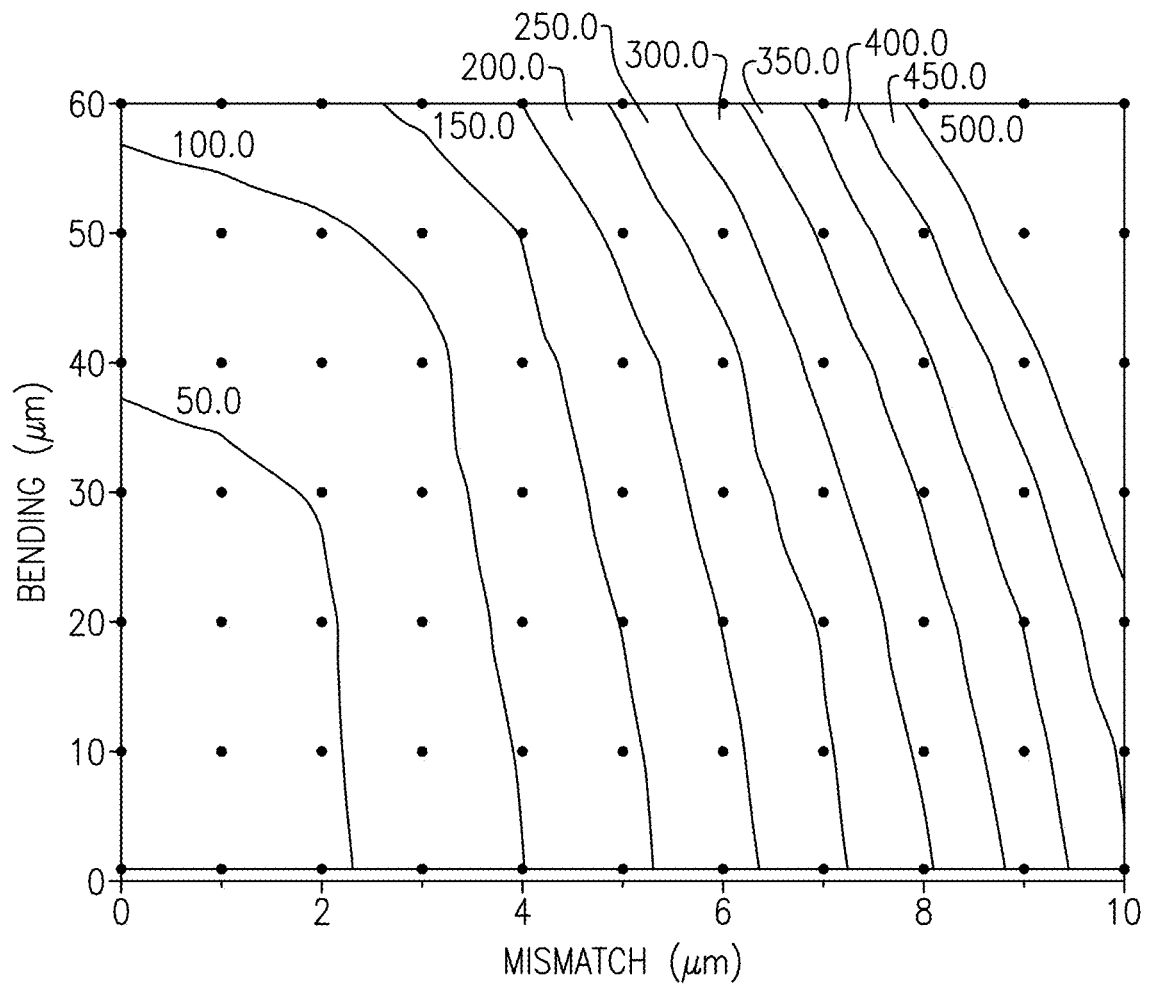
FIG. 7A is a graph of 3 dB roll-off frequency vs mismatch and bending according to known arrangements.
Figure 7B:
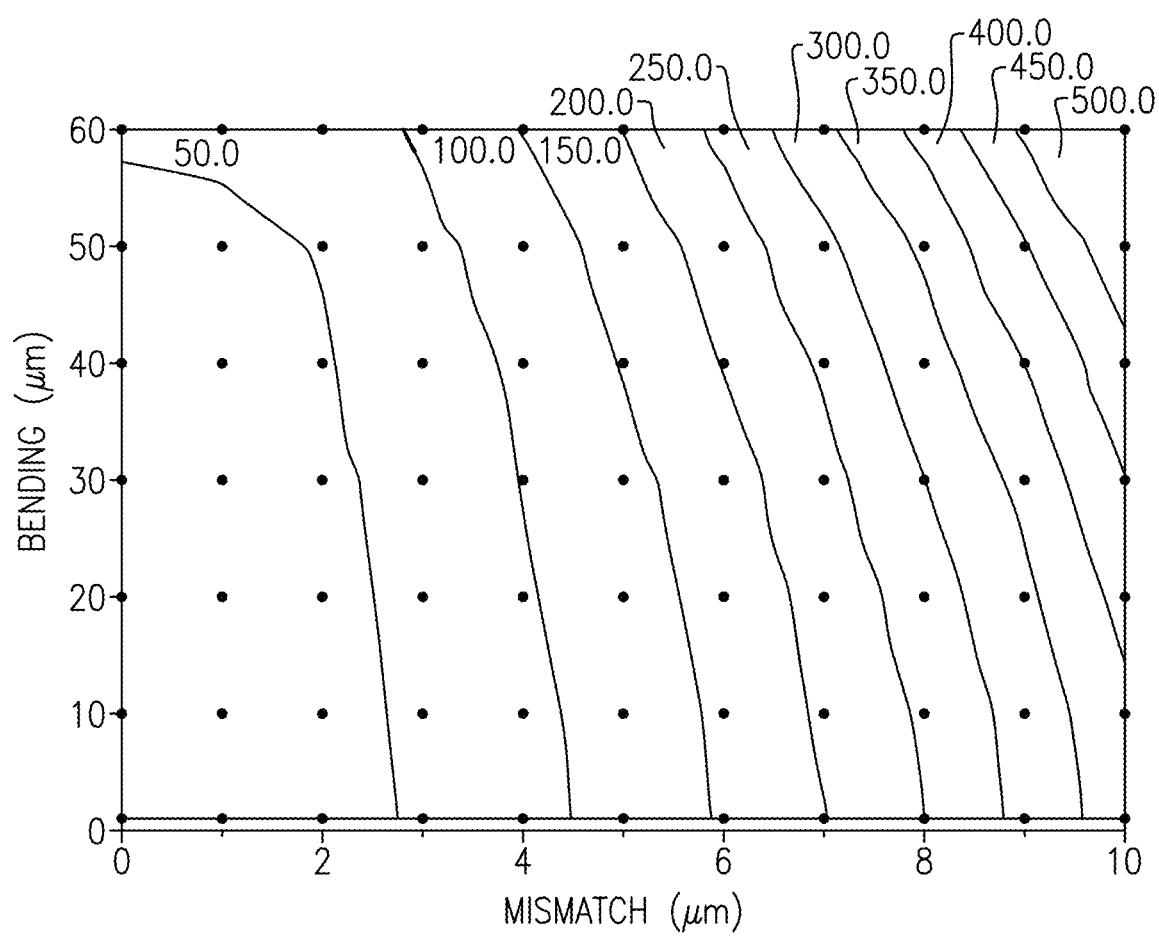
FIG. 7B is a graph of 3 dB roll-off frequency vs mismatch and bending according to aspects of the present invention.

FIGS. 7A and 7B show the 3 dB roll-off frequency for a microphone formed by the known process, and a microphone formed by the present invention, respectively. The resultant 3 dB roll-off frequency is shown for a mismatch, along the x-axis, between the two opposite cantilevers. The 3 dB roll-off frequency is also shown for a bending, along the y-axis, of a cantilever out of, or into the cavity. It will be appreciated that the graph is a contour graph, such that the 3 dB roll-off frequency may be any value between the adjacent two contour values.

As shown in FIG. 7A, a microphone in which the cantilevers are separated by fully etching the entire side of the cantilever, as shown in FIG. 1A, an increase in bending results in an increase in the 3 dB roll-off frequency. For example, a 40 micrometer bend out of, or into the cavity results in a 100 Hz 3 dB roll-off frequency, whereas a 30 micrometer bend results in a 50 Hz 3 dB roll-off frequency. As expected, an increase in bending increases the gap between cantilevers, as shown in the plan view of FIG. 1D. This results in an increase of flow of air into and out of the cavity, and thus lowers the sensitivity of the microphone. As shown in FIG. 7A, an increase in mismatch results in an increase in 3 dB roll-off frequency. However, a mismatch has a worse effect on the performance of the microphone. As shown, a mismatch of 2 micrometers results in a 50 Hz 3 dB roll-off frequency, whereas a 3 micrometer mismatch results in an 100 Hz 3 dB roll-off frequency, and a 4 micrometer mismatch results in a 150 Hz 3 dB roll-off frequency. The increase in frequency is due to a mismatch between the two cantilever beams creating a gap between the two cantilever beams which becomes larger with a small increase in mismatch. Whereas, a bending of the cantilever beams at the same amplitude, creates a smaller increase in gap size for the same amplitude. It will be appreciated, that the amplitude of the bending on the y-axis is the average bend of the two cantilevers, such that if one of the cantilevers bends 2 micrometers into the cavity, and the other bends 2 micrometers out of the cavity, the mismatch is 4 micrometers, and the bending is 0 micrometers.

FIG. 7B shows the performance of a microphone according to the present invention, in which the cantilevers are at least partially separated by breaking. As shown, an increase in bending increases the 3 dB roll-off frequency, as does an increase in mismatch, for the same reasons as described in relation to FIG. 7A. However, as shown, the microphone of FIG. 7B is more tolerant to bending of the cantilever. The 3 dB roll-off frequency for the microphone is around 50 Hz up to an amplitude of around 57 micrometers of bending of the cantilever, after which the 3 dB roll-off frequency will increase to around 100 Hz. Therefore there is a significant increase in performance of the microphone compared to the same amplitude of bending in a microphone in which the cantilevers are completely separated by fully etching. The present invention is advantageous as the gaps between the cantilevers, created by partial etching followed by breaking, are smaller than those created by fully etching. Therefore there is less gap for air to flow into and out of the cavity through. Therefore although bending of the cantilevers increases this gap, it is still much smaller than the arrangement of FIGS. 1A-D. As shown in FIG. 7B, the 3 dB roll-off frequency increases with a mismatch between the two cantilevers, for the same reasons as described with respect to FIG. 7A. It is shown that a microphone of an embodiment of the present invention is more tolerant to the mismatch of the cantilevers, compared to the arrangement of FIG. 1A-1D for the same amplitude of mismatch. As shown in FIG. 7B, a mismatch of around 2.5 micrometers results in a 50 Hz 3 dB roll-off frequency, whereas around a 3 micrometer mismatch results in an 100 Hz 3 dB roll-off frequency, and around a 4.5 micrometer mismatch results in a 150 Hz 3 dB roll-off frequency. Compared to FIG. 7A, the microphone of the present invention therefore has a better performance. The microphone of the present invention provides a better tolerance for the bending of the cantilevers, than for the mismatch of the bending of the cantilevers. This is because the bending of both cantilevers into or out of the cavity does not result in a significant change in the gap size seen in the plan view, as shown in FIG. 1D, due to the minimal gap between the cantilevers in the present invention. Whereas a mismatch in the bending of the cantilevers results in a change in the gap size similar to the change that would be seen in prior arrangements. This is because a 2 micrometer mismatch would be substantially the same size whether the gap between the cantilevers in plan view was big or small. Therefore air is able to flow laterally, between the mismatched cantilevers and into or out of the cavity. A narrower gap created through breaking the cantilevers apart does not affect this change in gap size in the cross sectional view due to a mismatch in cantilevers as greatly as the narrower gap affects the change in gap size created by the cantilever bending.

Figure 7C:
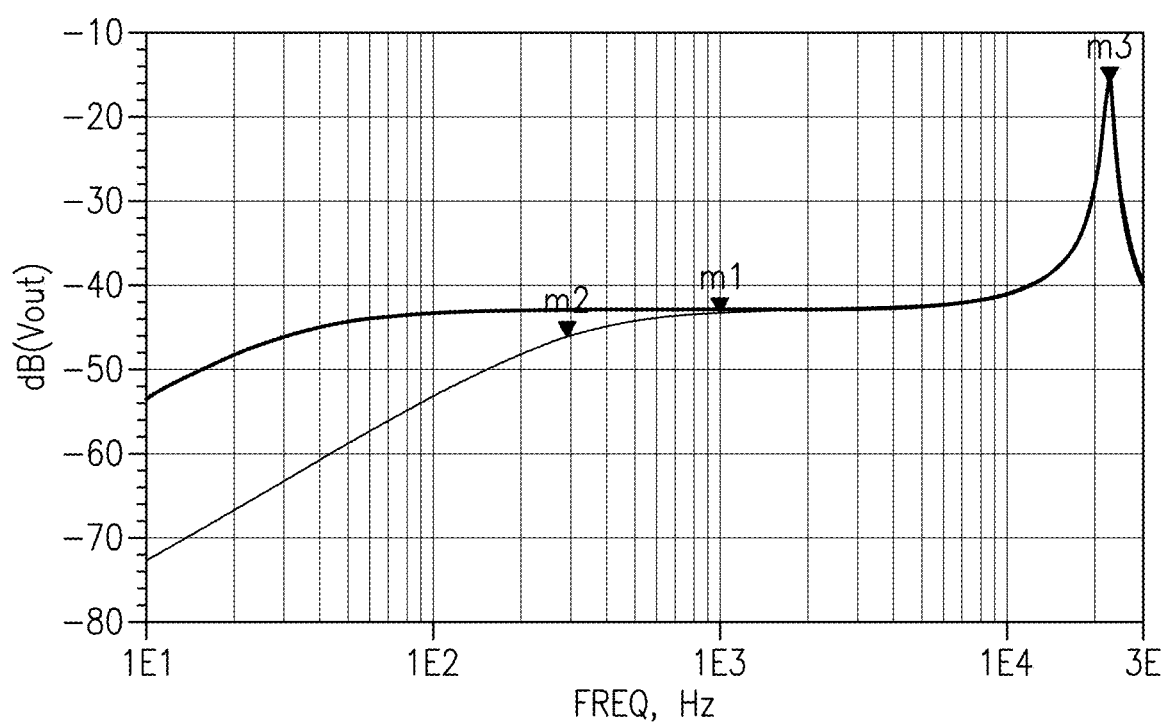
FIG. 7C is a graph of sensitivity vs frequency comparing a known arrangement with an embodiment of the present invention.

FIG. 7C illustrates the change in 3 dB roll-off frequency between the small gap of the present invention, and a larger gap, either from a larger etched gap between the two cantilevers, or due to mismatch or bending in the present invention. As shown, a smaller gap results in a lower roll-off frequency (shown by the difference in m1 and m2). Whereas, a larger gap, due to mismatch or bending, results in a larger roll-off frequency. This change is due to an increase in air leakage resulting from a larger gap between the cantilevers. It will be appreciated that the graph of FIG. 7C is for illustrator purposes only, and the roll-off frequency will vary with changes in gap size.

Manufacturing Methods of a MEMS Microphone

The method of manufacturing of the piezoelectric MEMS microphone will now be described. It is noted that although this technique is described in relation to the microphone described in this application, it is compatible with any piezoelectric MEMS microphone. It will be appreciated that the features of the microphone as described in the above description may be implemented here, such as but not limited to the materials and dimensions. It will be appreciated that in the methods described herein, for exemplary purposes an embodiment is described in which the piezoelectric film layer is separated by perforations, by fully etching the piezoelectric layer, and partial etching and breaking, with the center of the piezoelectric film layer being separated by partial etching and breaking. However, it will noted that the methods described herein may be used to create the cantilevers in any of the embodiments described herein, such as the embodiment in which the piezoelectric film layers comprise perforations in the center.

FIGS. 8A-8D illustrates a cross sectional view of a first method for manufacturing the piezoelectric MEMS device of an embodiment of the present invention as described in embodiments disclosed herein. The cross sectional view is taken along the lines A and B as illustrated in FIG. 4A. It will be appreciated that in the arrangement, the cavity comprises four walls, two end walls and two side walls, such that they meet at right angles to form a rectangular or square cross section. The arrangement also comprises four cantilevered beams, such that that each beam has a fixed end supported by the anchor region of the device, i.e., supported by the cavity walls. Therefore, it is noted that the methods described herein, such as etching, will be applied to the additional two cavity walls and additional two beams. It will be noted that any shape of cavity may be used, such that the four walls do not meet at right angles, or such that there may only be three walls. It will be noted that any shape of beam may be used, such that the beams extend to form a rectangle in the plane parallel to the surface of the substrate, or such that there is only one beam.

Figure 8A:
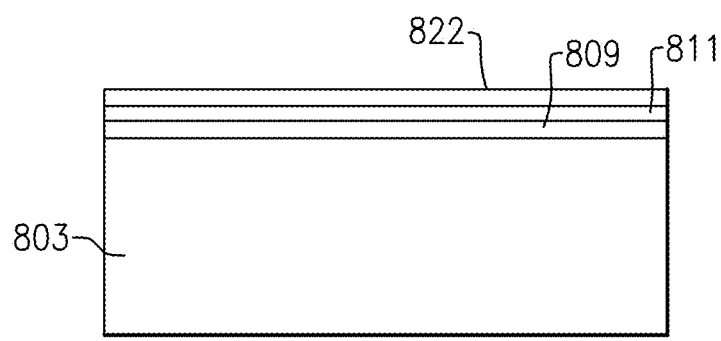

The first step of FIG. 8A illustrates a piezoelectric film layer 811 deposited on a substrate 803. Preferably the piezoelectric film layer 811 is composed of Aluminum Nitride, however it will be appreciated that any suitable piezoelectric material may be used, such as scandium-doped aluminum nitride. The piezoelectric film layer 811 may be deposited using any suitable technique, such as physical vapor deposition techniques. For example the piezoelectric film layer 811 may be deposited using a sputtering technique to form a piezoelectric film layer with a polycrystalline structure. However it will be appreciated that other techniques may be used such as molecular beam epitaxy. A photoresist layer 822 is disposed on the piezoelectric film layer 811. The photoresist layer may be any suitable material, such as a polymer. Preferably the substrate 803 is composed of Silicon, however it will be appreciated that any suitable material may be used. Preferably there is an insulating layer 809 located between the piezoelectric film layer 811 and substrate 805. Preferably the insulating layer is silicon dioxide, and is formed by oxidizing the silicon substrate, optionally by thermal oxidation, such that a layer of silicon dioxide forms on the surface.

It will be noted that for illustrative purposes additional features in the embodiment, such as electrodes, are not included in the figures. However, it will be noted that these may be deposited layer by layer on and/or between the piezoelectric layers, during this step. The electrode is patterned after deposition. It will noted that any suitable conductive material can be used for the electrodes, for example molybdenum or titanium, or others. Although not shown, in some embodiments there may be one electrode, or in some embodiments there may be two electrodes wherein the electrodes are located on both the back side and front side of the piezoelectric material, and in some embodiments a third may be located between piezoelectric film layers, as shown in FIGS. 6B and 6C. As illustrated the piezoelectric film layer 811 and substrate 803 are solid in the first step of manufacture. As described herein, the electrode is preferably located adjacent the anchor region of the substrate, and away from the etched sections, as described herein.

Figure 8B:
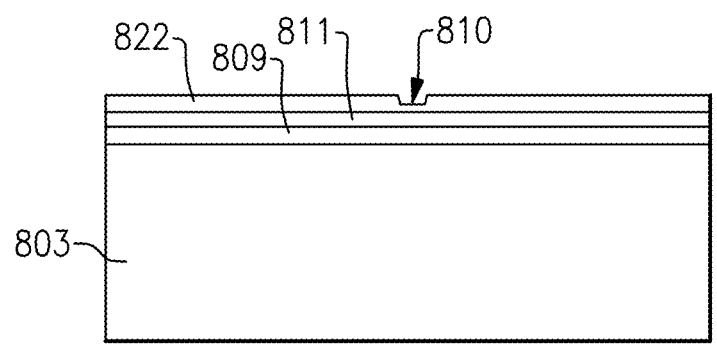

FIG. 8B, shows the etching of the photoresist layer 822. During the etching of the photoresist layer, the layer is dissolved using any suitable technique. In the forming of a partial etch, as in the method described here, the photoresist layer is not etched completely, such that a piezoelectric film layer is not exposed in this step. To achieve this, a smaller critical dimension is selected such that less light reaches the photoresist layer, and not all of the depth of the photoresist is removed. The walls of the etched photoresist layer may be slanted, as shown in figure, due to an insufficient amount of energy used to remove photoresist layer 822.

FIG. 8C illustrates the second step of etching, in which the remaining thickness of photoresist layer 822 and part of the piezoelectric film layer 811 is etched. The piezoelectric film layer 811 is not fully etched, such that the insulating portion is not exposed, and instead there is a remaining portion of piezoelectric film layer 811 left. In some embodiments the etch is created from the front side using a dry anisotropic etching process. However, it will be noted that any suitable etching process may be used. Optionally, for a piezoelectric film layer composed of AlN, Cl2 may be used to etch the AlN in a reactive ion etch. The etch created may be any width. Preferably the width is around 0.2 micrometers to 1 micrometer.

To create a cavity 801, as illustrated in 8D, an area from the back side of the substrate 803 is etched. The etching may be isotropic or anisotropic silicon etching, such that the silicon is etched, but the silicon dioxide is not etched, and therefore acts as a protection layer for the piezoelectric material 811. Preferably Sulfur hexafluoride (SF6) is used to etch the silicon, as it does not etch silicon dioxide. Subsequently the silicon dioxide is removed by a silicon dioxide etch. The etching process may be isotropic or anisotropic. This etching step removes the remaining silicon dioxide from the underside of the beam, but the insulating layer located between the cavity walls and the piezoelectric layer is protected by the silicon walls and remains. This etching process creates the walls of the cavity 805 from the substrate 803. As shown in FIG. 8D, the photoresist layer is removed, using any suitable process.

FIG. 8E illustrates the breaking of the remaining piezoelectric film layer 811, into two separate cantilevered beams 816a and 816b. Once the substrate has been removed, the piezoelectric film layer 811 may be under sufficient stress to break along the partially etched sections, at which point the polycrystalline piezoelectric material is weakened. In some embodiments there may be sufficient intrinsic stress due to manufacturing for the piezoelectric film layer 811 to break. In other embodiments, other techniques may be used to break the piezoelectric film layer. For example, thermal cycling may be used to introduce stress in the material. In other embodiments a mechanical shock, or an acoustic shock, or a pressure shock, or any other suitable method may be used to break the piezoelectric film layer along the partially etched material. The gap 820 created by the breaking of the piezoelectric film layer 811 is around 0 micrometers in width, which is smaller than is possible using etching techniques.

Once the piezoelectric film layer 811 has been broken into separate cantilevers 816a and 816b, the cantilevers are free to move. However, in some embodiments, a further wet etch may be used to increase the gap 820 between the cantilevers. A diluted solution of etchant may be used to increase the width of the gap 820 to around 1-2 nanometers. In some embodiments this is required, so that the cantilevers are able to bend into and out of the cavity in response to acoustic signals, without contacting each other. In other embodiments, once the piezoelectric film layer 811 has been released by removing the substrate 803, and has been separated by breaking the partial etch to create a gap 820, the cantilevers 816a and 816b may shrink due to stress. This may increase the gap 820 to around 2 nanometers. Therefore, an additional wet may not be required.

FIG. 8A-8E illustrate a cross sectional view of a second method for making a piezoelectric MEMS microphone. It will be noted that the figures are for illustrative purposes only, and the features are not to scale. The cross sectional view is taken along the lines A and B shown in FIG. 4A, such that the trenches and cavities as described in the embodiments herein, may be created in any shape in the plane of the surface of the silicon. Preferably the shape of trenches on the surface of the substrate are such that the edge of the cavity walls are manufactured with indents to correspond to the protrusion in the one or more electrodes. Therefore, in the preferred embodiment, the trenches are shaped such that the edge of the cavity wall has two straight edges, and a semicircle or semi ellipse indent in the center of the two straight edges. As described in relation to the embodiment of FIG. 4, the electrode preferably has a protrusion with a 300 micrometer width and a depth of 5 micrometers. Therefore, the cavity wall is manufactured to have an indent of width 300 micrometers and a depth of 5 micrometers. The cavity wall and electrodes may be manufactured such that there is a small overlap, to take into account manufacturing tolerances, which may be around 2-3 micrometers.

As described in relation to FIG. 8, in the preferred embodiment the cavity comprises four walls comprising two end walls and two side walls, such that they meet at right angles to form a rectangular or square cross section. The embodiment also comprises four cantilevered beams, such that that each beam has a fixed end supported by the anchor region of the device, i.e., supported by the cavity walls. Therefore, it is noted that the methods described herein, such as etching, will be applied to the additional two cavity walls and additional two beams. It will be noted that any shape of cavity may be used, such that the four walls do not meet at right angles, or such that there may only be three walls. It will be noted that any shape of beam may be used, such that the beams extend to form a rectangle in the plane parallel to the surface of the substrate, or such that there is only one beam. The substrate is substantially deep such that the cavity may formed having a depth of around 400 micrometers.

It will be noted that in FIGS. 8A-8E, the cross-sectional view only shows the partial etch of the one or more piezoelectric film layers. However, the microphone is a three-dimensional device, and it will be appreciated, as described above, that along other cross sectional views, there are perforations. Perforations are sections in which the entire thickness of the one or more piezoelectric film layers are etched, such that there is a gap, or hole completely through the one or more piezoelectric film layers. The method of forming these perforations is described herein, such as in relation to FIGS. 2A-2C. It will be appreciated that the methods of forming these perforations are able to be combined with the method as described in FIGS. 8A-8E. Such as, the photoresist layer would be removed to its entire depth in the equivalent step of FIG. 8B, by using a critical dimension through which the sufficient amount of light could be applied to the photoresist layer. In the equivalent step to FIG. 8C, the entire thickness of the piezoelectric film layer would be removed, to form a perforation. The method for removing the substrate, and silicon dioxide would be the same as described in FIGS. 8A-8E, and there would be no breaking of the piezoelectric film layer required.

Figure 9:
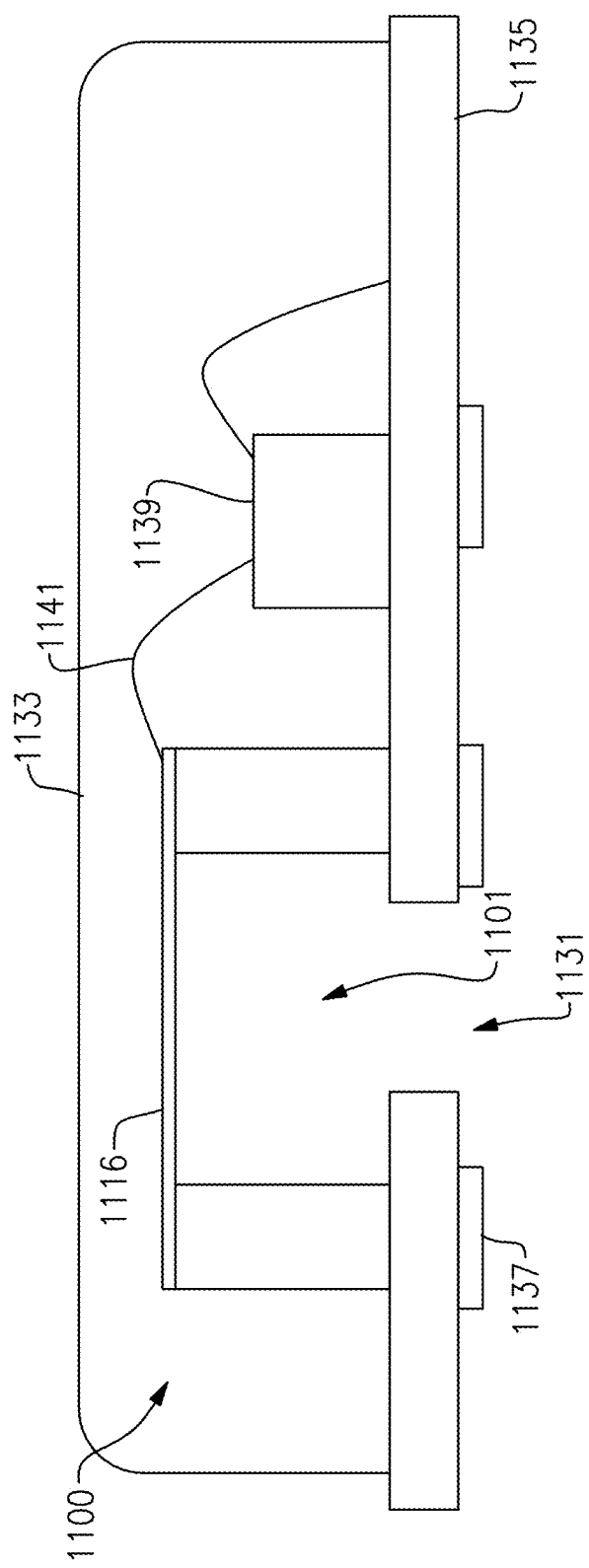
FIG. 9 is a plan view of a microphone arrangement in accordance with the present invention.

FIG. 9 illustrates a cross sectional view of a microphone arrangement comprising the microphone of embodiments described herein. It will be appreciated that this is an example embodiment for illustrative purposes, and the microphone can be included in a variety of different arrangements. As illustrated, the microphone 1100 of FIG. 9 is located within a cap 1133. The cap may be flexible or rigid, and may be any suitable material such as a metallic material. The cap creates a seal with a substrate 1135 (for example a printed circuit board), such that air only flows into and out of the arrangement via a sound inlet 1131. The substrate 1135 may be any suitable material. The cap 1133 also mitigates electromagnetic interference. Sound waves enter the arrangement, causing the cantilevered beam 1116 to bend and produce voltage due to the piezoelectric effect, as described herein. The arrangement comprises at least one solder pad 1137 such that the microphone arrangement may be soldered to external devices, not shown here. The microphone arrangement further comprises an application specific integrated circuit chip/die ("ASIC") 1139. The MEMS microphone is electrically connected by wire bonding 1141. Although not shown, it will be appreciated that the wire bonding may be connected to the one or more electrodes of the microphone, as described herein.

It will be noted that FIG. 9 is a cross sectional view of the microphone arrangement, such that the one or more solder pads, substrate 1135, MEMS microphone 1100, ASIC 1139, and cap 1133 extend into the page such that they are three-dimensional, as described in relation to other embodiments disclosed herein.

Figure 10:
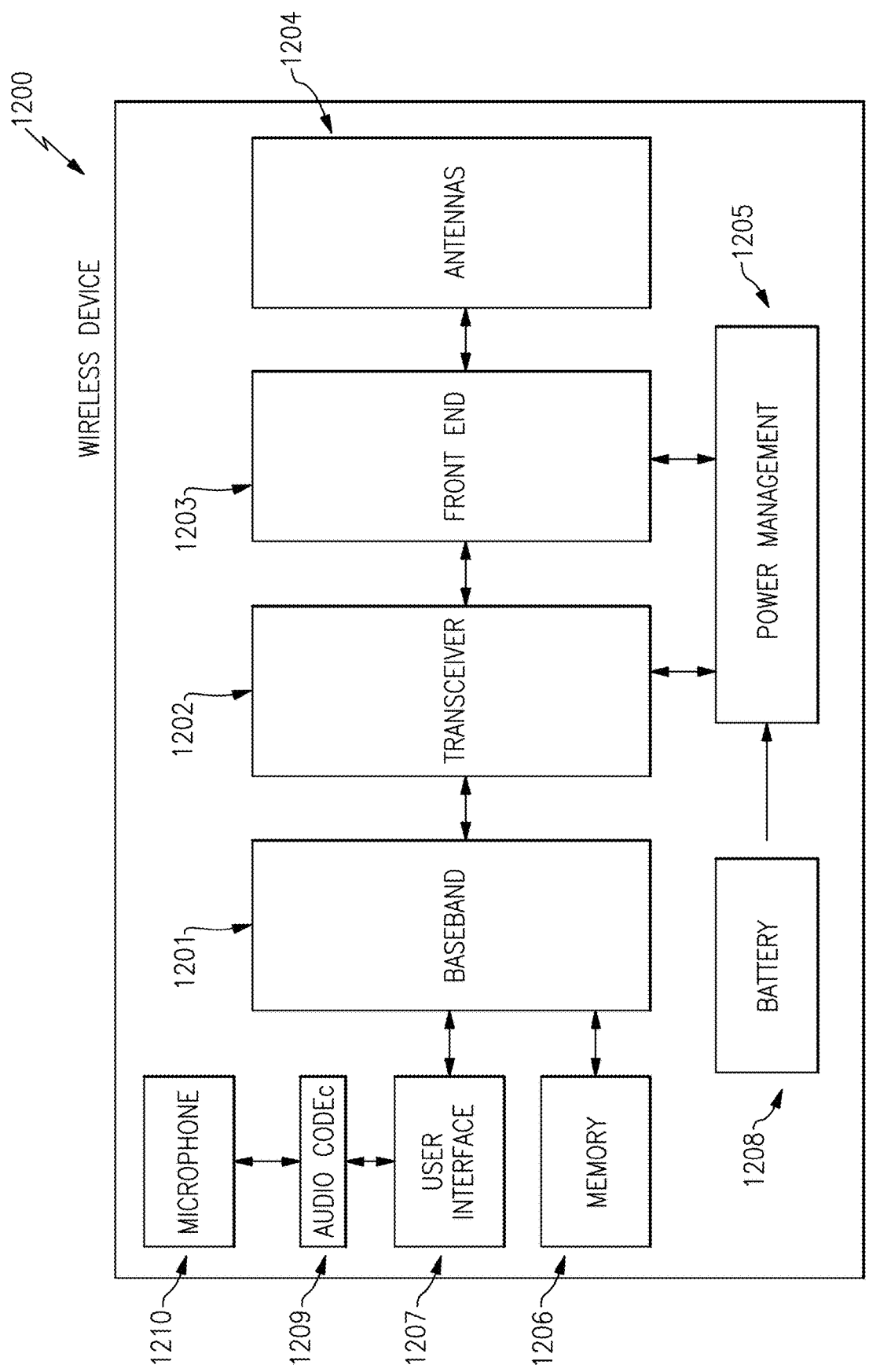
FIG. 10 is a schematic diagram of a wireless device in accordance with the present invention.

FIG. 10 is a schematic diagram of one embodiment of a wireless device 1200. The wireless device can be, for example but not limited to, a portable telecommunication device such as, a mobile cellular-type telephone. The wireless device includes a microphone arrangement 1200, including a microphone according to embodiments described herein in relation to FIGS. 4 to 8, and may include one or more of a baseband system 1201, a transceiver 1202, a front end system 1203, one or more antennas 1204, a power management system 1205, a memory 1206, a user interface 1207, a battery 1208, and audio codec 1209. The microphone arrangement may supply signals to the audio codec 1209 which may encode analog audio as digital signals or decode digital signals to analog. The audio codec 1209 may transmit the signals to a user interface 1207. The user interface 1207 transmits signals to the baseband system 1201. The transceiver 1202 generates RF signals for transmission and processes incoming RF signals received from the antennas.

The transceiver 1203 aids in conditioning signals transmitted to and/or received from the antennas 1204.

The antennas 1204 can include antennas used for a wide variety of types of communications. For example, the antennas 1204 can include antennas 1204 for transmitting and/or receiving signals associated with a wide variety of frequencies and communications standards.

The baseband system 1201 is coupled to the user interface to facilitate processing of various user input and output, such as voice and data. The baseband system 1201 provides the transceiver 1202 with digital representations of transmit signals, which the transceiver 1202 processes to generate RF signals for transmission. The baseband system 1201 also processes digital representations of received signals provided by the transceiver 1202. As shown in FIG. 10, the baseband system 1201 is coupled to the memory to facilitate operation of the wireless device.

The memory can be used for a wide variety of purposes, such as storing data and/or instructions to facilitate the operation of the wireless device and/or to provide storage of user information.

The power management system 1205 provides a number of power management functions of the wireless device.

The power management system 1205 receives a battery voltage from the battery 1208. The battery 1208 can be any suitable battery for use in the wireless device, including, for example, a lithium-ion battery.

Having described above several aspects of at least one embodiment, it is to be appreciated various alterations, modifications, and improvements will readily occur to those skilled in the art. Such alterations, modifications, and improvements are intended to be part of this disclosure and are intended to be within the scope of the invention. Accordingly, the foregoing description and drawings are by way of example only, and the scope of the invention should be determined from proper construction of the appended claims, and their equivalents.

For the purpose of description, it will be understood that a module can be a physical module and/or a functional block configured to provide a desired modular functionality with one or more devices and/or circuits. For example, a physical module can be a packaged module implemented on a packaging substrate, a packaged die configured to be mounted on a circuit board, or any other physical device configured to provide RF functionality. It will also be understood that a module can include one or more physical devices, including a plurality of physical devices with each sometimes being referred to as a module itself.

Also for the purpose of description, it will be understood that a component can be physical device and/or an assembly of one or more devices and/or circuits configured to provide a functionality. In some situations, a component can also be referred to as a module, and vice versa.

The present disclosure describes various features, no single one of which is solely responsible for the benefits described herein. It will be understood that various features described herein may be combined, modified, or omitted, as would be apparent to one of ordinary skill. Other combinations and sub-combinations than those specifically described herein will be apparent to one of ordinary skill, and are intended to form a part of this disclosure.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list. The word "exemplary" is used exclusively herein to mean "serving as an example, instance, or illustration." Any implementation described herein as "exemplary" is not necessarily to be construed as preferred or advantageous over other implementations.

The disclosure is not intended to be limited to the implementations shown herein. Various modifications to the implementations described in this disclosure may be readily apparent to those skilled in the art, and the generic principles defined herein may be applied to other implementations without departing from the spirit or scope of this disclosure. The teachings of the invention provided herein can be applied to other methods and systems, and are not limited to the methods and systems described above, and elements and acts of the various embodiments described above can be combined to provide further embodiments. Accordingly, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

The invention claimed is:

1. A method for making a microelectromechanical systems microphone, the method comprising:
   depositing a piezoelectric film layer onto a substrate;
   selectively etching the piezoelectric film layer to define lines, the selectively etching including both etching the entire thickness at selected positions of the piezoelectric film layer to form perforations and etching the piezoelectric film layer less than the entire thickness to form partial etches between the perforations along the lines;
   removing a portion of the substrate to define a cavity; and
   breaking the piezoelectric film layer along the lines, such that the microphone has at least two cantilevered beams.

2. The method of claim 1 wherein the breaking the piezoelectric film layer includes applying thermal cycling.

3. The method of claim 1 wherein the breaking the piezoelectric film layer includes applying mechanical shock.

4. The method of claim 1 wherein the breaking the piezoelectric film layer includes applying air pressure.

5. The method of claim 1 wherein the breaking the piezoelectric film layer includes breaking by intrinsic stress.

6. The method of claim 1 wherein the breaking forms a gap and the method further comprising using wet etching to widen the gap after breaking.

7. The method of claim 1 further comprising depositing electrodes adjacent an anchor region.

8. The method of claim 1 wherein the piezoelectric film layer is deposited by sputtering.

9. The method of claim 1 further comprising oxidizing the substrate to form an insulating layer located between the substrate and piezoelectric film layer.

10. A method for making a microelectromechanical systems microphone, the method comprising:
    depositing a piezoelectric film layer onto a substrate;
    selectively etching the piezoelectric film layer to define lines;
    removing a portion of the substrate to define a cavity; and
    breaking the piezoelectric film layer along the lines, such that the microphone has at least two cantilevered beams, the breaking forming a gap and the depositing of the piezoelectric layer providing intrinsic stress to the layer such that the gap formed by breaking is widened due to the intrinsic stress.

11. The method of claim 10 wherein the selectively etching includes etching the entire thickness at selected positions of the piezoelectric film layer to form perforations along the lines.

12. The method of claim 10 wherein the selectively etching includes etching less than the entire thickness of the piezoelectric film layer to form partial etches along the lines.

13. The method of claim 10 wherein the selectively etching includes both etching the entire thickness at selected positions of the piezoelectric film layer to form perforations and etching the piezoelectric film layer less than the entire thickness to form partial etches between the perforations along the lines.

14. A method for making a microelectromechanical systems microphone, the method comprising:
    depositing a piezoelectric film layer onto a substrate;
    selectively etching the piezoelectric film layer to define lines;
    removing a portion of the substrate to define a cavity;
    breaking the piezoelectric film layer along the lines, such that the microphone has at least two cantilevered beams; and
    depositing a photoresist layer.

15. The method of claim 14 wherein the method further comprises removing a section of the photoresist layer.

16. A method for making a cantilevered piezoelectric transducer, the method comprising:
    depositing a piezoelectric film layer onto a substrate;
    selectively etching the piezoelectric film layer to define lines, the selectively etching includes both etching the entire thickness at selected positions of the piezoelectric film layer to form perforations and etching the piezoelectric film layer less than the entire thickness to form partial etches between the perforations along the lines;
    removing a portion of the substrate to make sidewalls in the substrate that define a cavity;
    depositing one or more electrodes in contact with the piezoelectric film layer; and
    breaking the piezoelectric film layer along the lines to form at least two cantilevered portions of the piezoelectric film layer, the at least two cantilevered portions supported by the sidewalls.

17. The method of claim 16 wherein the one or more electrodes are adjacent an anchor region where the piezoelectric film layer is coupled one or more of the sidewalls.

18. The method of claim 16 wherein the one or more electrodes are configured to output an electrical signal caused by charges generated by the piezoelectric film layer in response to sound waves.

* * * * *